(12) United States Patent
Makiuchi et al.

(10) Patent No.: US 6,710,378 B1
(45) Date of Patent: Mar. 23, 2004

(54) SEMICONDUCTOR LIGHT RECEPTION DEVICE OF END FACE LIGHT INCIDENCE TYPE

(75) Inventors: Masao Makiuchi, Kawasaki (JP); Nami Yasuoka, Kawasaki (JP); Haruhisa Soda, Kawasaki (JP); Takuya Fujii, Nakakoma (JP)

(73) Assignees: Fujitsu Limited, Kawasaki (JP); Fujitsu Quantum Devices Limited, Yamanashi (JP)

( * ) Notice: Subject to any disclaimer, the term of this patent is extended or adjusted under 35 U.S.C. 154(b) by 206 days.

(21) Appl. No.: 09/645,876

(22) Filed: Aug. 25, 2000

(30) Foreign Application Priority Data

Oct. 29, 1999 (JP) .......................................... 11-309851

(51) Int. Cl.[7] .......................................... H01L 31/109
(52) U.S. Cl. ........................ 257/184; 257/432; 257/436
(58) Field of Search .......................... 257/80, 184, 432, 257/436, 466

(56) References Cited

U.S. PATENT DOCUMENTS

| | | | | |
|---|---|---|---|---|
| 5,404,006 A | * | 4/1995 | Scahffner et al. | 250/208.2 |
| 5,521,994 A | * | 5/1996 | Takeuchi et al. | 257/14 |
| 5,701,379 A | | 12/1997 | Takeuchi | |
| 5,789,765 A | * | 8/1998 | Nishikata et al. | 257/86 |
| 6,031,253 A | * | 2/2000 | Kobayashi | 257/99 |
| 6,194,771 B1 | * | 2/2001 | Kato et al. | 257/436 |
| 6,198,853 B1 | * | 3/2001 | Yamada | 385/2 |

* cited by examiner

*Primary Examiner*—Sara Crane
(74) *Attorney, Agent, or Firm*—Staas & Halsey LLP

(57) ABSTRACT

A photo sensor is formed in a partial area of the principal surface of a substrate. The photo sensor includes a light reception layer parallel to the principal surface, the light reception layer being made of semiconductor and generating carriers in response to received light. A light waveguide is formed in a partial area of the principal surface of the substrate, the light waveguide propagating light in a direction parallel to the principal surface and introducing light into the light reception layer. A semi-insulating semiconductor film covers side faces of the photo sensor. A pair of electrodes flows current into the light reception layer of the photo sensor in a thickness direction of the light reception layer. A semiconductor light reception device having a structure suitable for high-speed operation and easy to manufacture is provided.

20 Claims, 17 Drawing Sheets

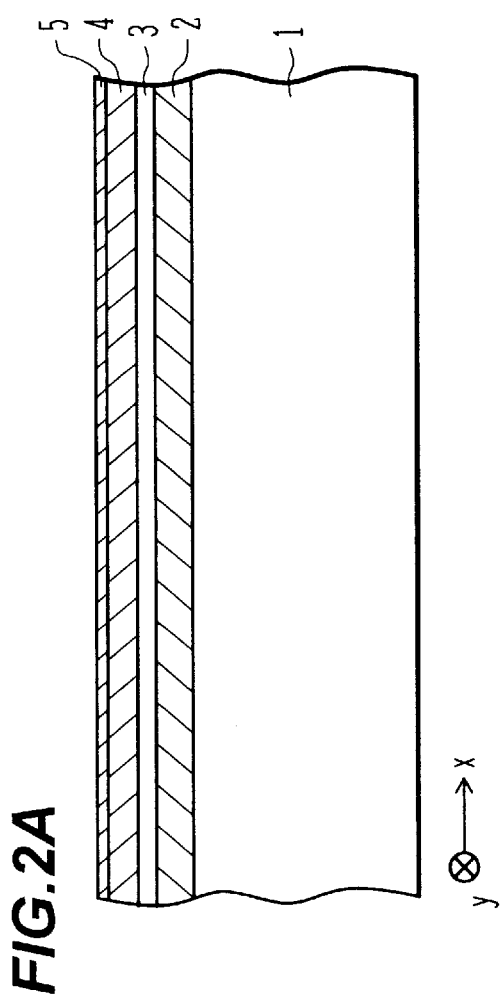
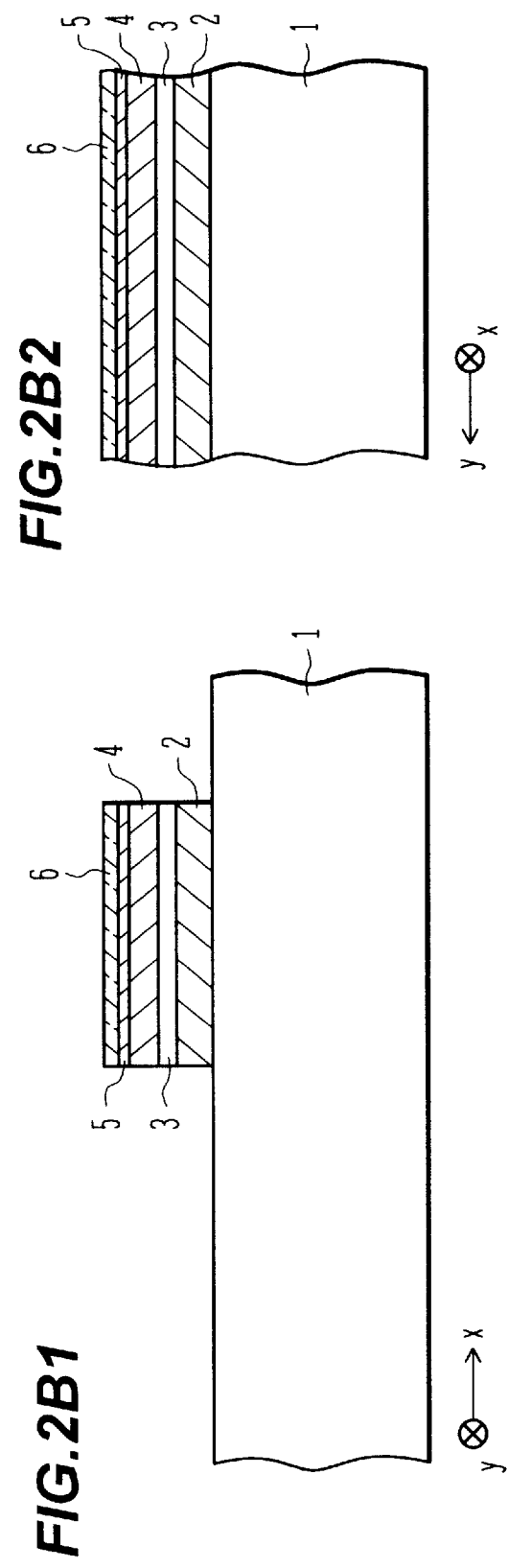

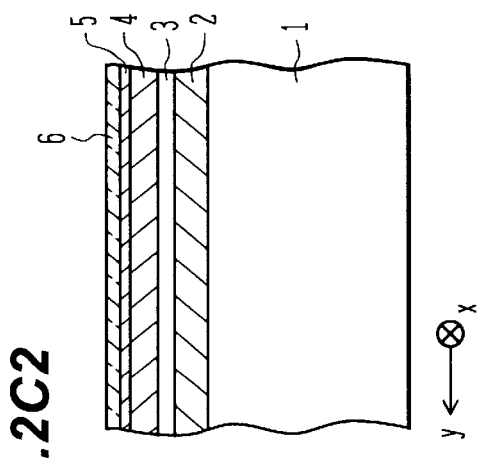
FIG.2C2
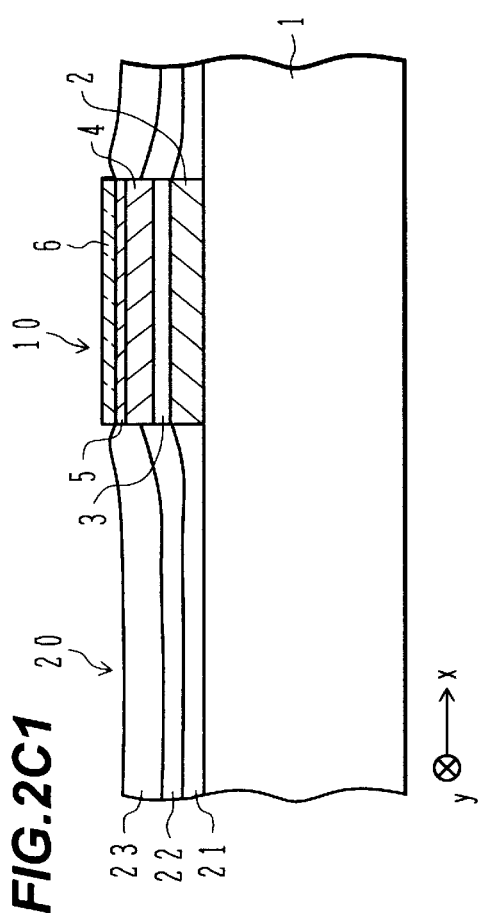
FIG.2C1
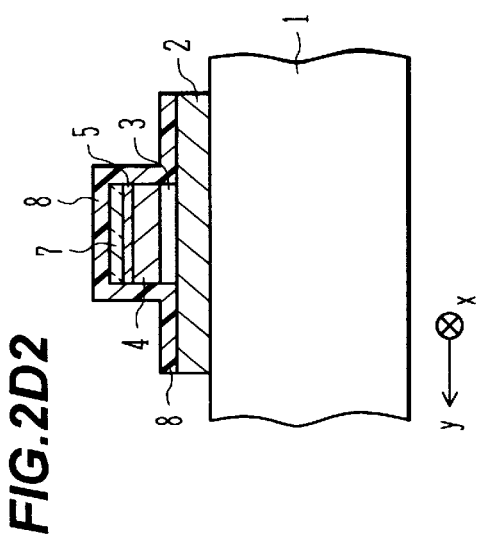
FIG.2D2
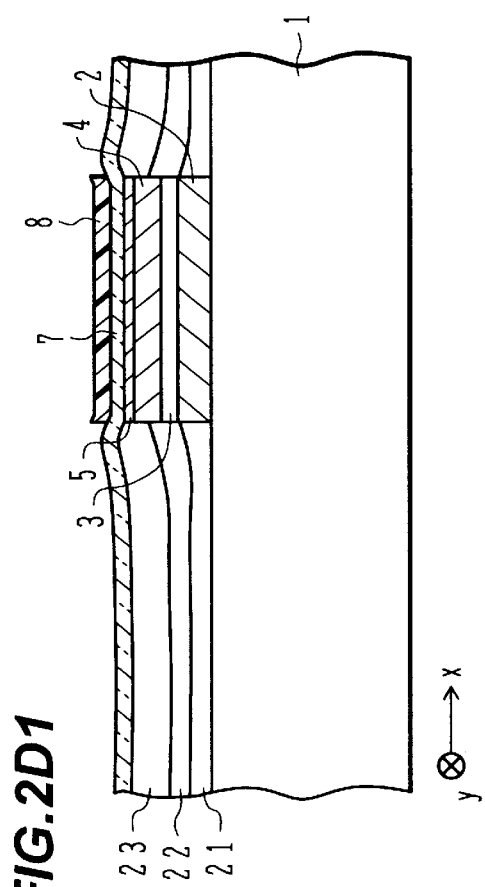
FIG.2D1

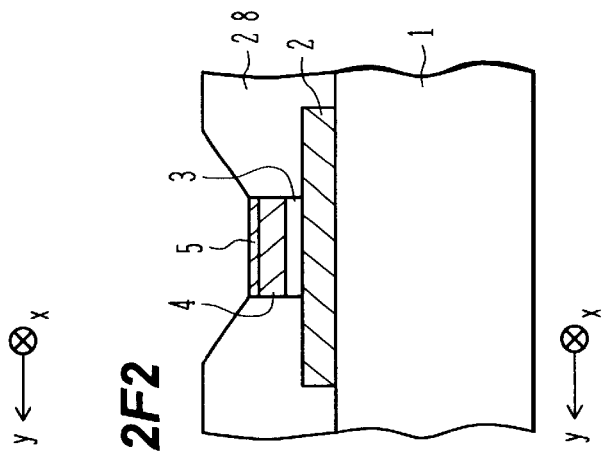
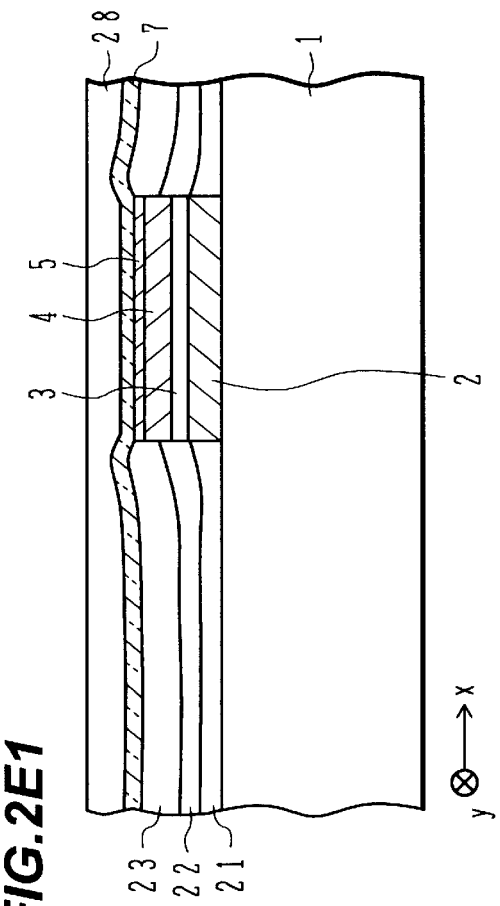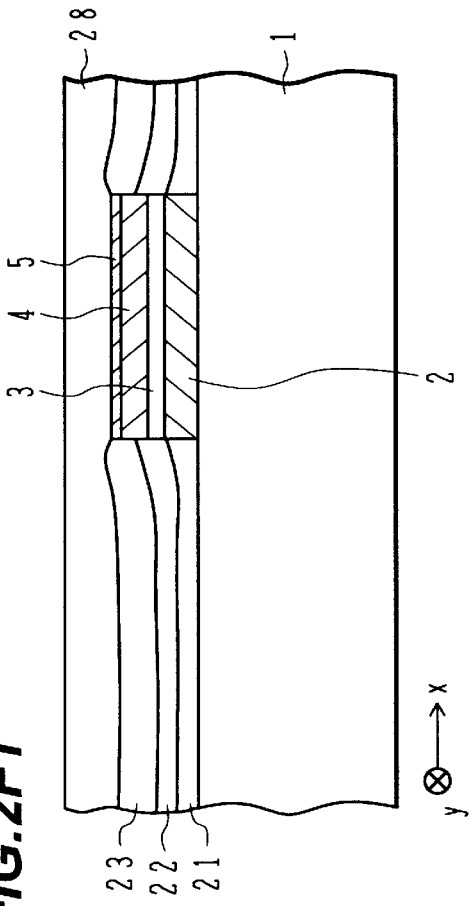

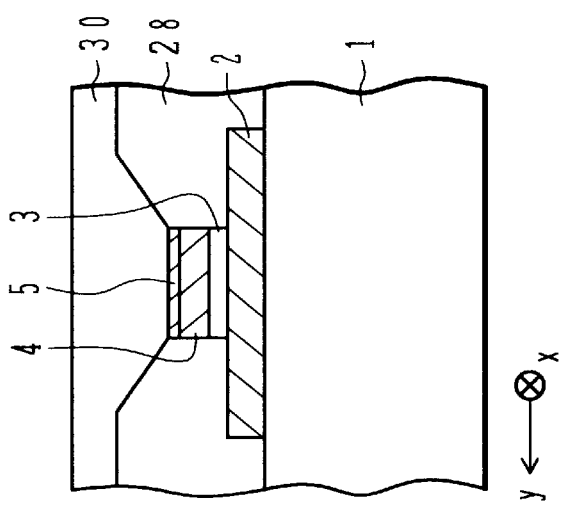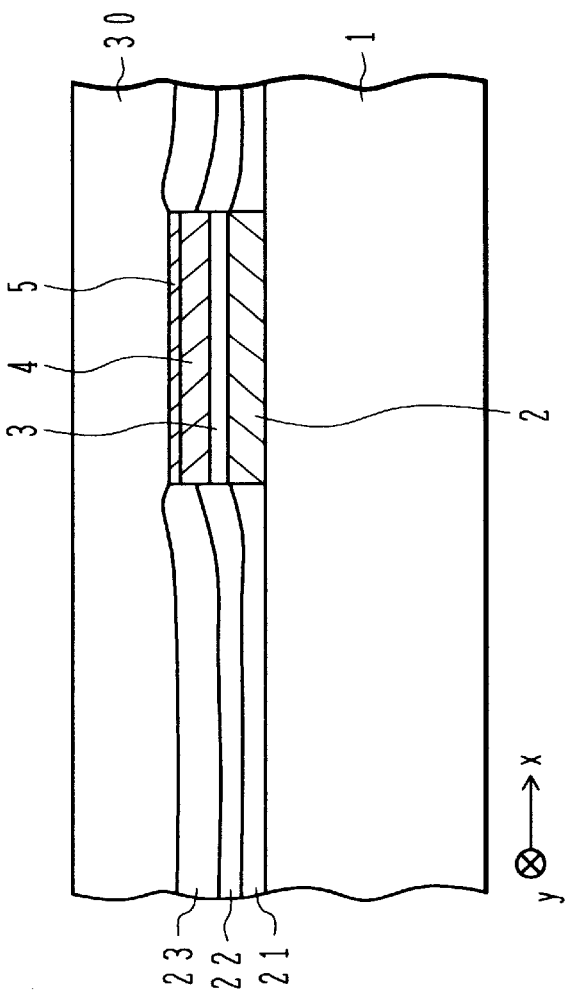

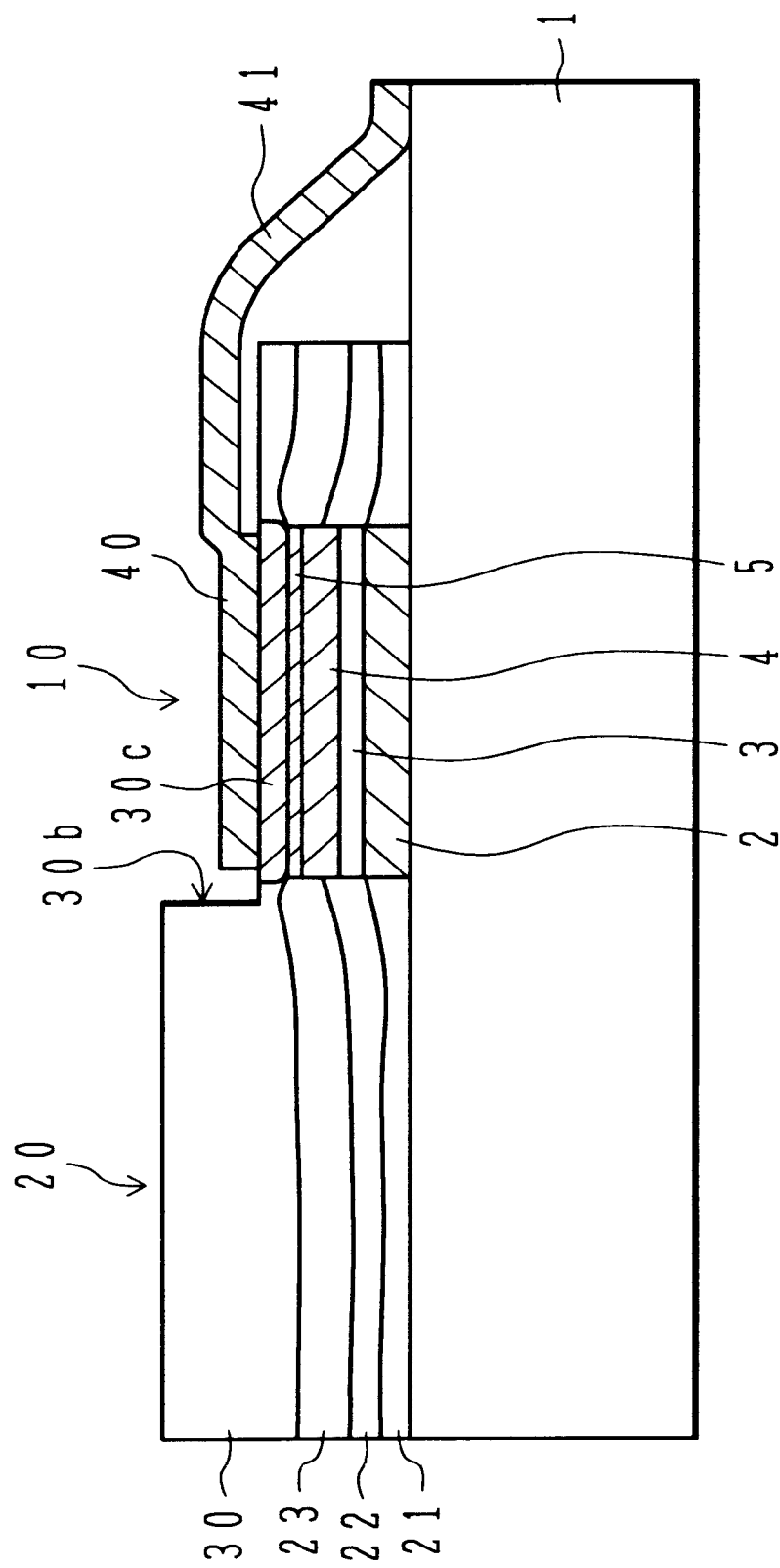

SEMICONDUCTOR LIGHT RECEPTION DEVICE OF END FACE LIGHT INCIDENCE TYPE

This application is based on Japanese Patent Application HEI 11-309851, filed on Oct. 29, 1999, the entire contents of which are incorporated herein by reference.

BACKGROUND OF THE INVENTION a) Field of the Invention

The present invention relates to a semiconductor light reception device and more particularly to a semiconductor-light reception device in which light is incident upon an end face of a light reception layer. A data transmission speed of 40 GHz or higher is required for high-speed optical communications. Attention has been paid to pin type photodiodes as a light reception element capable of high-speed operation.

b) Description of the Related Art

InGaAs is used as a material for detecting light having a wavelength of 1.55 μm used in optical communications. In order to absorb almost 100% of light incident upon an InGaAs layer along its thickness direction, it is desired to set a thickness of the InGaAs layer to 3 μm or thicker. It takes some time for an external circuit to detect carriers generated by light absorption and moved in the InGaAs layer along its thickness direction to the external circuit. If a data transmission speed is low, a propagation time of carriers in the InGaAs layer does not become a critical issue. However, at a data transmission speed over 30 GHz, it becomes difficult to speed up the data transmission speed because the carrier propagation time hinders it.

If light is made incident upon an end face of a thinner InGaAs layer and generated carriers are propagated along a thickness direction of the thinner InGaAs layer, sufficient light can be absorbed and a carrier propagation time can be shortened. The above problem can be solved in this case.

Generally, InGaAs or the like is used as the intrinsic layer (light reception layer) of a pin type photodiode in a band of a wavelength of 1.55 μm, and InP or the like is used as the p-type and n-type layers. An operation speed is limited by a frequency of $1/(2\Pi CR)$ where C is an electrostatic capacitance of a pin type photodiode and R is its load resistance. In order to realize a high-speed operation, it is therefore desired to make the electrostatic capacitance C smaller.

The electrostatic capacitance C can be made small by thickening the light reception layer. However, as the light reception layer is made thick, a carrier propagation time taken for the carriers to move along the thickness direction and reach the interface becomes long. In order to reduce the electrostatic capacitance C without thickening the light reception layer, it is desired to reduce the area of a pin junction.

It is difficult, however, to incorporate a process of forming a photodiode with a pin junction of a small area by cleaving a wafer on the whole surface of which pin junctions are formed. For example, the light reception characteristics of pin type photodiodes become different if cleaving positions vary.

SUMMARY OF THE INVENTION

It is an object of the present invention to provide a semiconductor light reception device suitable for a high-speed operation and easy to manufacture.

According to one aspect of the present invention, there is provided a semiconductor light reception device comprising: a substrate having a principal surface; a photo sensor formed in a partial area of the principal surface of the substrate, the photo sensor including a light reception layer parallel to the principal surface, the light reception layer being made of semiconductor and generating carriers in response to received light; a light waveguide formed in a partial area of the principal surface of the substrate, the light waveguide propagating light in a direction parallel to the principal surface and introducing light into the light reception layer; an insulating or high resistance side protective film covering at least a portion of a side face of the photo sensor; and electrodes for flowing current into the light reception layer of the photo sensor in a thickness direction of the light reception layer.

Since the photo sensor and light waveguide are formed on the same substrate, the size of a chip can be maintained large to some degree even if the photo sensor is small. When chips are cut from a wafer, the wafer is cut across the light waveguides and not across the photo sensors. The reappearance of the characteristics of semiconductor light reception devices can be maintained stable.

BRIEF DESCRIPTION OF THE DRAWINGS

FIGS. 2A to 2G1 and 2G2 are cross sectional views of the semiconductor light reception device of the first embodiment, illustrating its manufacture processes.

FIG. 5 is a cross sectional view of a semiconductor light reception device according to a second embodiment.

DETAILED DESCRIPTION OF THE PREFERRED EMBODIMENTS

Figure 1A:
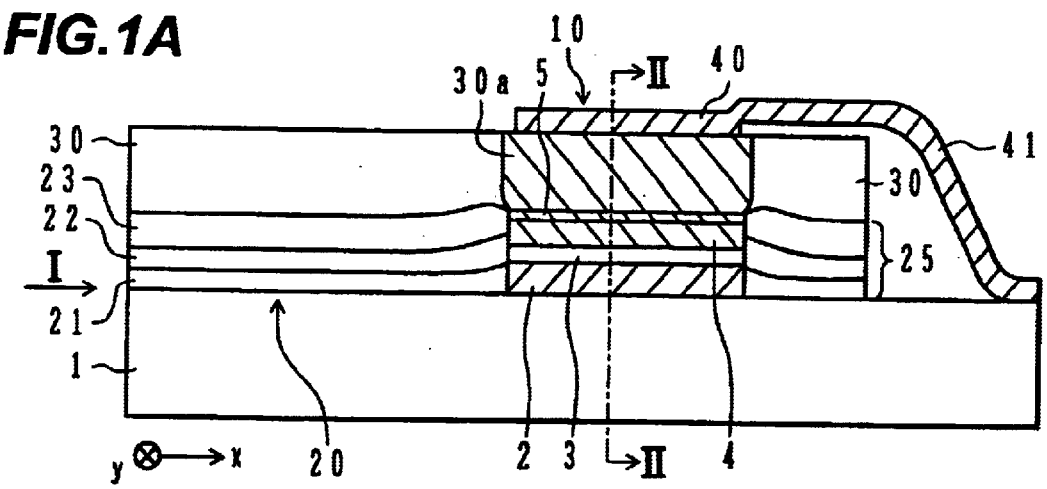
FIGS. 1A and 1C are cross sectional views of a semiconductor light reception device according to a first embodiment of the invention.
Figure 1B:
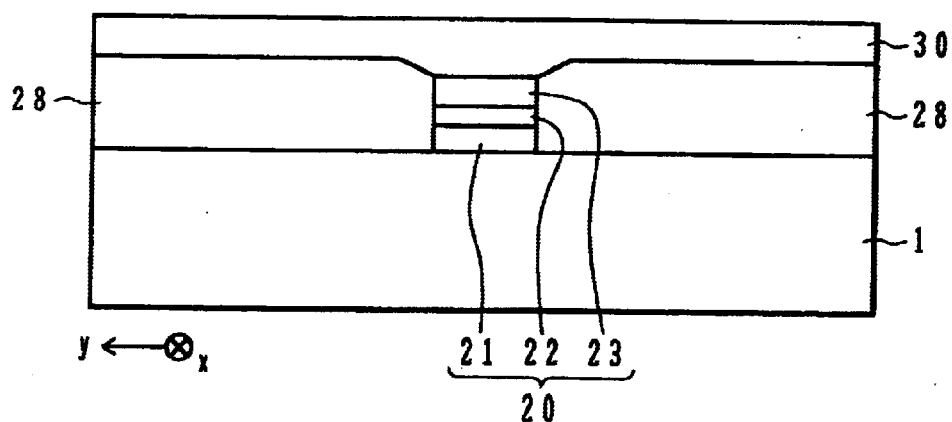
FIG. 1B is a side view of the light reception device.
Figure 1C:
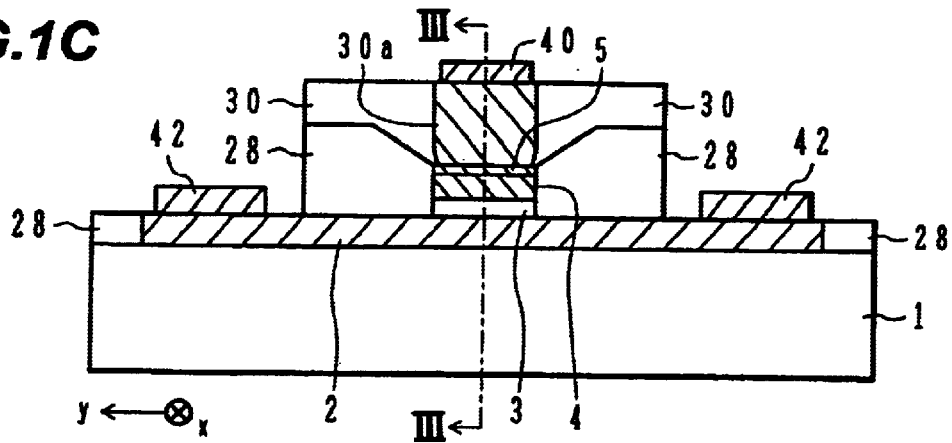

With reference to FIGS. 1A to 1C, the structure of a semiconductor light reception device according to the first embodiment of the invention will be described. FIG. 1A is a cross sectional view of the semiconductor light reception device of the first embodiment, as viewed along an optical axis of incidence light. FIG. 1B is a side view (light incidence end face) as viewed along an arrow I direction shown in FIG. 1A. FIG. 1C is a cross sectional view taken along one-dot chain line II-II shown in FIG. 1A. A cross sectional view taken along one-dot chain line III-III shown in FIG. 1C corresponds to that shown in FIG. 1A. For convenience of description, the lateral direction of FIG. 1A is defined as an x-direction and the direction perpendicular to the drawing sheet is defined as a y-direction.

As shown in FIG. 1A, on a partial area of a principal surface of a semi-insulating InP substrate 1, an n-type layer 2 made of n-type InP, a light reception layer 3 made of non-doped InGaAs, a p-type layer 4 made of p-type InP and a cap layer 5 made of p-type InGaAs are stacked in this order from the bottom.

The n-type layer 2 is doped with sulfur (S) as impurities at a concentration of $1 \times 10^{17}$ to $1 \times 10^{19}$ cm$^{-3}$. A thickness of the n-type layer 2 is 1 to 2 μm. A thickness of the light reception layer 3 is 0.1 to 0.5 μm. The p-type layer 4 is doped with zinc (Zn) as impurities at a concentration of $1 \times 10^{17}$ to $1 \times 10^{19}$ cm$^{-3}$. A thickness of the p-type layer 4 is 1 to 1.5 μm. A thickness of the cap layer 5 is 0.05 μm. A pin type photodiode constituted of the n-type layer 2, light reception layer 3 and p-type layer 4 forms a photo sensor 10.

A light waveguide 20 contacting the end face of the photo sensor 10 is formed on the surface of the InP substrate 1 in an area adjacent to the photo sensor 10 (to the left of the photo sensor 10 in FIG. 1A). The light waveguide 20 has a lamination structure of a lower clad layer 21, a core 22 and an upper clad layer 23 stacked in this order from the bottom. The lower and upper clad layers 21 and 23 are made of non-doped InP, and the core 22 is made of non-doped InGaAsP.

An end face of the core 22 on the side of the photo sensor 10 is in contact with the end face of the light reception layer 3. The core 22 is made gradually thicker at positions nearer to the photo sensor 10. A thickness of the core 22 on the side of the photo sensor 10 is thicker than that of the light reception layer 3. An end face of the light waveguide 20 on the side opposite to the photo sensor 10 is formed by cleaving the InP substrate 1.

A semiconductor member 25 having the same lamination structure as that of the light waveguide 20 is in contact with an end face of the photo sensor 10 on the side opposite to the light waveguide 20 (to the right of the photo sensor 10 in FIG. 1A). The principal surface of the InP substrate 1 is exposed in a right area of the semiconductor member 25.

An upper protective film 30 made of InP is formed on the light waveguide 20, photo sensor 10 and semiconductor member 25. Of the upper protective film 30, the film on the photo sensor 10 forms a conductive region 30a doped with Zn and imparted with a p-type conductivity. This conductive region 30a is electrically connected to the cap layer 5. Of the upper protective film 30, the region other than the conductive region 30a forms a non-doped region.

The upper surface of the conductive region 30a is in ohmic contact with a p-side electrode 40 made of AuZn alloy. This p-side electrode 40 is electrically connected via an air bridge 41 made of gold (Au) to a pad formed on the principal surface of the InP substrate 1.

As shown in FIG. 1B, side protective films 28 are formed on both sides of the light waveguide 20. The side protective film 28 is made of insulating or high resistance InP. Insulating or high resistance means that the side protective film has a resistance higher than the n-type layer 2 and p-type layer 4 in order for current to concentrate upon the photo sensor 10.

As shown in FIG. 1C, the n-type layer 2 is disposed extending to both sides of the lamination structure of the light reception layer 3, p-type layer 4 and cap layer 5. The side protective films 28 are in contact with both sides of the light reception layer 3, p-type layer 4 and cap layer 5. The upper protective film 30 is formed on the side protective films 28 and cap layer 5. The conductive region 30a is electrically connected to the cap layer 5. The p-side electrode 40 is formed on this conductive region 30a.

The surface of the n-type layer 2 is in ohmic contact with an n-side electrode 42 in an area outside of the area where the side protective films 28 are formed. The n-side electrode 42 has a two-layered structure of an AuGe alloy layer and an Au layer.

Next, with reference to FIGS. 2A to 2G1 and 2G2, a manufacture method for the semiconductor light reception device of the first embodiment will be described. FIGS. 2A, 2B1, 2C1, 2D1, 2E1, 2F1, and 2G1 correspond to the cross sectional view of FIG. 1A. FIGS. 2B2, 2C2, 2D2, 2E2, 2F2 and 2G2 correspond to the cross sectional view of FIG. 1C.

As shown in FIG. 2A, on the surface of a semi-insulating InP substrate 1, an n-type layer 2 made of n-type InP, a light reception layer 3 made of non-doped InGaAs, a p-type layer 4 made of p-type InP and a cap layer 5 made of p-type or non-doped InGaAs are grown by metal organic chemical vapor deposition (MO-CVD).

As shown in FIGS. 2B1 and 2B2, the lamination structure from the n-type layer 2 to the cap layer 5 is etched by using a SiO$_2$ pattern 6 as a mask. This etching process is performed by chemical etching. As etchant for etching InP and InGaAs, mixed solution of HBr, H$_2$O$_2$ and H$_2$O, mixed solution of HCl and H$_2$O, mixed solution of H$_2$SO$_4$, H$_2$O$_2$ and H$_2$O, and the like are known.

Figure 3:
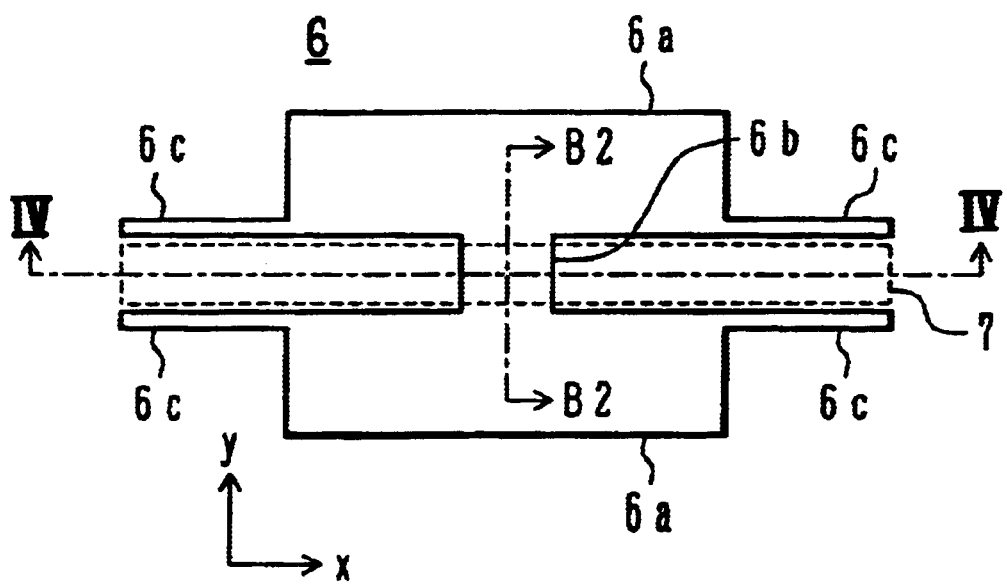
FIG. 3 is a plan view showing an example of an $SiO_2$ pattern shown in FIGS. 2B1 and 2B2.

FIG. 3 shows the plan view of the SiO$_2$ pattern. One-dot chain line IV-IV shown in FIG. 3 corresponds to the cross sectional view of FIG. 2B1, and one-dot chain line B2—B2 corresponds to the cross sectional view of FIG. 2B2. The SiO$_2$ pattern 6 has: two parallel broad stripe areas 6a extending in the x-direction; a connection area 6b interconnecting the two stripe areas 6a approximately at their middle portions; and narrow stripe areas 6c disposed along virtual straight lines extending from opposite lower ends of the each of the stripe portions 6a. The connection area 6b corresponds to the photo sensor 10 shown in FIG. 1A.

As shown in FIGS. 2C1 and 2C2, on the principal surface of the InP substrate 1, a lower clad layer 21 made of InP, a core 22 made of InGaAsP and an upper clad layer 23 made of InP are sequentially and selectively grown. These layers are not grown on the SiO$_2$ pattern 6.

The growth speed becomes lower at the remoter position from the connection area 6b of the SiO$_2$ pattern 6 shown in FIG. 3 in the x-direction. Therefore, as shown in FIG. 2C1, the core 22 becomes thicker at the position nearer to the photo sensor 10. After this selective growth, the SiO$_2$ pattern 6 is removed.

As shown in FIGS. 2D1 and 2D2, a SiO$_2$ pattern 7 is formed on the upper clad layer 23 and cap layer 5. The SiO$_2$ pattern 7 covers an elongated area 7 defined by the stripe areas 6a and 6c shown in FIG. 3. By using the SiO$_2$ pattern 7 as a mask, the lamination structure from the light reception layer 3 to the cap layer 5 is etched. For example, this etching is performed by plasma etching. Plasma etching can precisely control an etching depth and can make the sidewalls of the pattern generally at a right angle.

Next, partial areas of the n-type layer 2 are covered with a resist pattern 8. The resist pattern 8 covers the connection area 6b shown in FIG. 3 and an area extending from the connection area 6b in the y-direction. The n-type layer 2 is etched by using as a mask the SiO$_2$ pattern 7 and resist pattern 8. Thereafter, the resist pattern 8 is removed.

As shown in FIGS. 2E1 and 2E2, side protective films 28 made of semi-insulating InP are formed on the substrate surface not covered with the SiO$_2$ pattern 7. Thereafter, as shown in FIGS. 2F1 and 2F2, the SiO$_2$ pattern 7 is removed.

As shown in FIGS. 2G1 and 2G2, an upper protective film 30 made of semi-insulating InP is formed on the whole surface of the substrate. The lamination structure formed on the principal surface of the InP substrate 1 is patterned as shown in FIGS. 1A and 1C. This patterning is performed by plasma etching. Plasma etching can precisely control an etching depth. After the plasma etching, a surface damage layer is removed by chemical etching.

As shown in FIG. 1C, an n-side electrode 42 is formed on a partial surface area of the n-type layer 2 exposed outside of the side protective films 28. For example, the n-side electrode 42 is formed by lift-off. Next, a p-side electrode 40 and an air bridge 41 shown in FIG. 1A are formed.

Figure 4A:
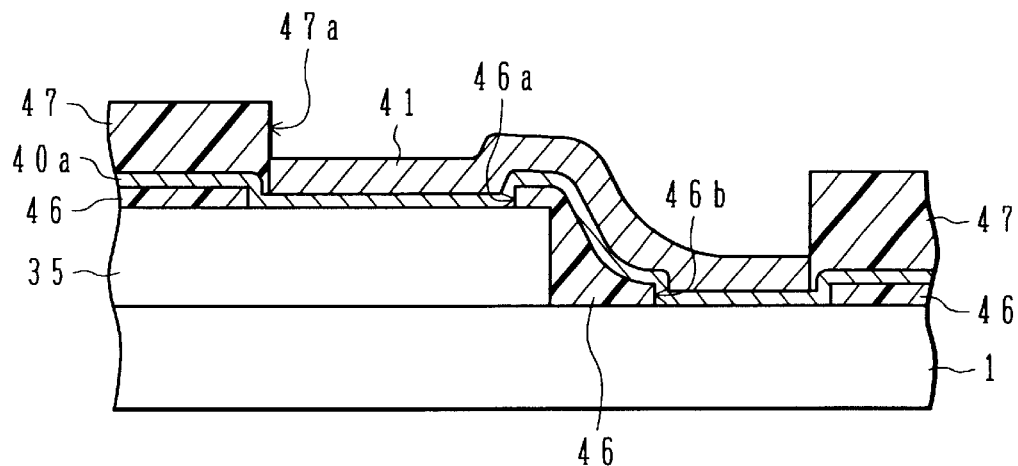
FIGS. 4A and 4B are cross sectional views of an air bridge shown in FIG. 1A, illustrating its manufacture process.
Figure 4B:
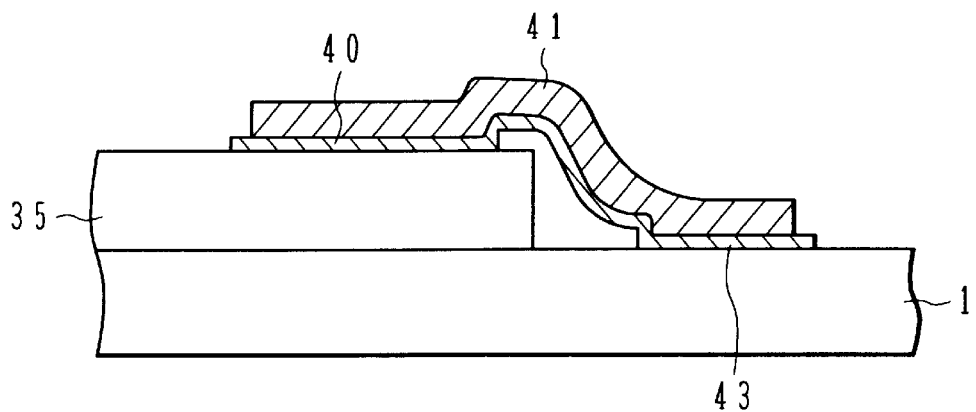

With reference to FIGS. 4A and 4B, a method of forming the p-side electrode 40 and air bridge 41 will be described.

As shown in FIG. 4A, the principal surface of the InP substrate 1 has a lamination structure 35 including the photo sensor 10 shown in FIG. 1A. On this substrate surface, a resist pattern 46 is formed having an opening 46a corresponding to a p-side electrode and an opening 46b corresponding to a pad. An AuZn/Au layer 40a (the AuZn layer being on the side nearer to the substrate) is vapor deposited on the substrate whole surface.

A resist pattern 47 is formed on the AuZn/Au layer 40a. The resist pattern 47 has an opening 47a for coupling the openings 46a and 46b. Gold plating is performed by using the AuZn/Au layer 40a as an electrode. An Au film 41 is therefore formed in the opening 47a. Gold plating does not occur on the resist pattern 47.

As shown in FIG. 4B, the resist patterns 47 and 46 are removed. A p-side electrode 40, a pad 43 and an air bridge 41 interconnecting the p-side electrode 40 and pad 43 are therefore left.

In operation of the semiconductor light reception device of the first embodiment, a reverse bias is applied from an external circuit to the pin junction of the photo sensor 10 shown in FIG. 1A. Light incident upon the light incidence end face of the light waveguide 20 propagates in the core 22 and becomes incident upon the light reception layer 3 of the photodiode 10. Carriers are therefore generated in the light reception layer 3 and move (drift) along the thickness direction of the light reception layer 3. When electrons reach the n-type layer 2 and holes reach the p-type layer 4, photocurrent is detected at the external circuit.

The end face of the photo sensor 10 of the semiconductor light reception device of the first embodiment shown in FIG. 1A is formed by photolithography as illustrated in the process shown in FIG. 2B1. The size of each pin junction is not influenced by a cleavage precision. Therefore, even if the area of the pin junction of the photo sensor 10 is small, photo sensors can be manufactured with good reproductivity. Since the cleaved face is positioned at the light waveguide, variation in cleaving positions does not influence the characteristics of the photo sensor.

In the first embodiment, as shown in FIG. 1C, the end faces of the pin junction are covered with the side insulating films 28 made of high resistance InP. Leak current flowing through the end faces of the pin junction can therefore be reduced. High resistance of the side insulating film 28 is intended to mean a high resistance sufficient for the current flowing between the p-side electrode 40 and n-side electrode 42 to concentrate upon the light reception layer 3 and hardly flow through the side insulating films 28. The resistance of the side insulating film 28 is required to be at least higher than those of the n-type layer 2 and p-type layer 4.

Also in the first embodiment, as shown in FIGS. 1A and 1C, the size of the p-side electrode 40 is generally equal to that of the pin junction. It is therefore possible to prevent unnecessary parasitic capacitance from being increased and an operation speed from being lowered by parasitic capacitance.

Next, with reference to FIG. 5, a semiconductor light reception device of the second embodiment will be described. In the first embodiment, the upper surface of the upper protective film 30 is approximately flat as shown in FIG. 1A. In the second embodiment, the upper surface of the upper protective film 30 has a step.

FIG. 5 is a cross sectional view of the semiconductor light reception device of the second embodiment. The upper protective film 30 on the photo sensor 10 is made thinner than the upper protective film 30 on the light waveguide 20, and a step 30b is formed at the boundary therebetween. The other structures are similar to those of the semiconductor light reception device of the first embodiment shown in FIG. 1A.

The step 30b of the upper protective film 30 can be formed by depositing the upper protective film 30 shown in FIG. 2G1 and thereafter partially etching the upper protective film 30 by masking the upper surface of the light waveguide 20. The height of the step 30b can be adjusted by regulating the etching time, or by forming an etching stopper layer at the depth where the etching is to be stopped. Since the upper protective film 30 on the photo sensor 10 is thin, it is possible to shorten the diffusion time of Zn while the conductive region 30c is formed on the cap layer 5. If the upper protective film 30 on the photo sensor 10 is plasma-etched until the surface of the cap layer 5 is exposed, the Zn diffusion process is not necessary.

Figure 6C:
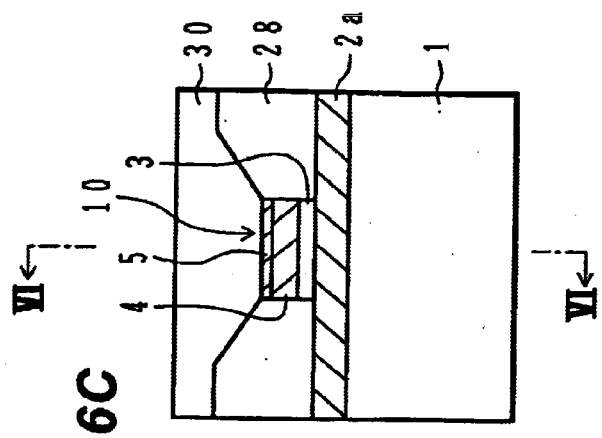
FIGS. 6A to 6C are cross sectional views of a semiconductor light reception device according to a third embodiment.
Figure 6A:
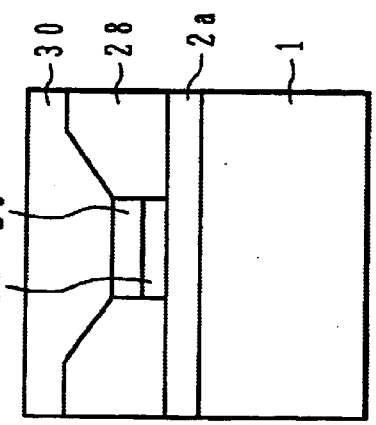
Figure 6B:
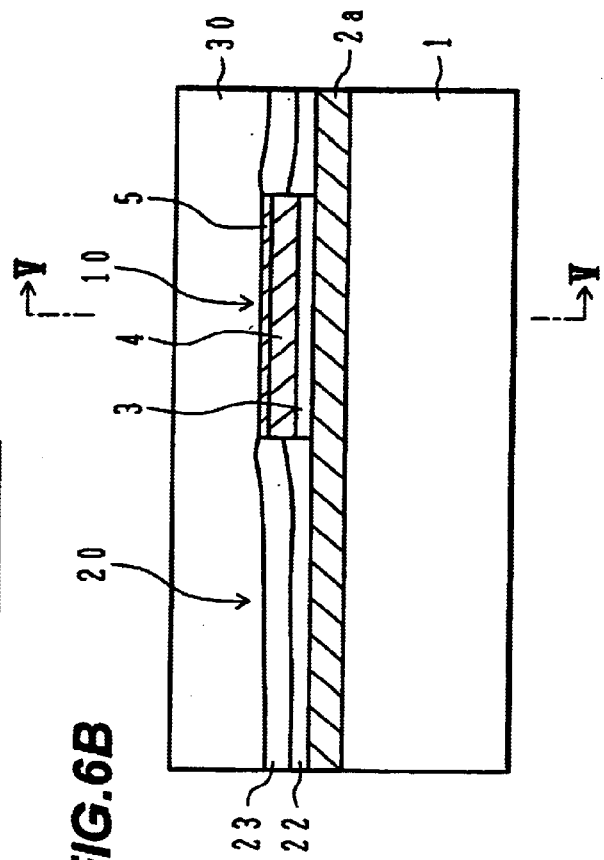

Next, with reference to FIGS. 6A to 6C, a semiconductor light reception device of the third embodiment will be described. FIG. 6A is a side view showing the light incidence end face of the semiconductor light reception device of the third embodiment, FIG. 6B is a cross sectional view taken along an optical axis of incidence light, and FIG. 6C is a cross sectional view taken along a direction perpendicular to the optical axis of incidence light (taken along one-dot chain line V-V shown in FIG. 6B). FIG. 6B corresponds to a cross sectional view taken along one-dot chain line VI-VI shown in FIG. 6C.

In the first embodiment, as shown in FIG. 1A, the width of the n-type layer 2 in the x-direction is equal to the width of the light reception layer 3 and p-type layer 4 formed over the n-type layer 2. In the third embodiment, as shown in FIGS. 6A to 6C, an n-type layer 2a is not patterned and covers the whole surface of the InP substrate 1.

The photo sensor 10 has a lamination structure of the n-type layer 2a, light reception layer 3, p-type layer 4 and cap layer 5 stacked in this order from the bottom, similar to the structure of the first embodiment. In the first embodiment, as shown in FIG. 1A, the lower clad layer 21 of the light waveguide 20 is made of non-doped InP. In the third embodiment, the n-type layer 2a serves also as the lower clad layer of the light waveguide 20. Namely, the n-type layer 2a of the photo sensor 10 and the n-type layer of the light waveguide 20 have the same composition and film thickness and are continuous in terms of crystallography.

This structure is formed by stopping the etching process of the first embodiment shown in FIG. 2B1 at the upper surface of the n-type layer 2. Mixed solution of $H_3PO_4$ and HCl may be used for etching InP, and mixed solution of $H_2O$, $H_3PO_4$ and $H_2O_2$ may be used for etching InGaAs. The process of patterning the n-type layer 2 of the first embodiment shown in FIG. 2D1 is not necessary.

In the first embodiment, it is necessary to strictly control the thickness of the lower clad layer 21 in order to couple the core 22 and light reception layer 3 shown in FIG. 1A. In the third embodiment, since the n-type layer 2a serves also as the lower clad layer, it is easy to make the height of the core 22 be flush with the height of the light reception layer 3. A method of forming lead wires to electrodes will be later described with reference to FIGS. 12A and 12B and FIG. 13.

Figure 7C:
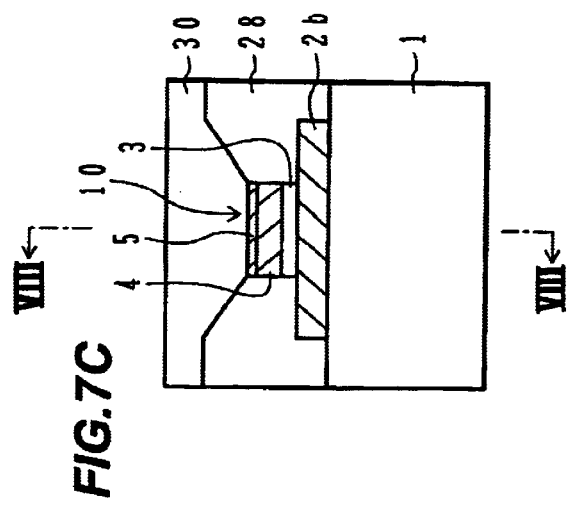
FIGS. 7A to 7C are cross sectional views of a semiconductor light reception device according to a fourth embodiment.
Figure 7A:
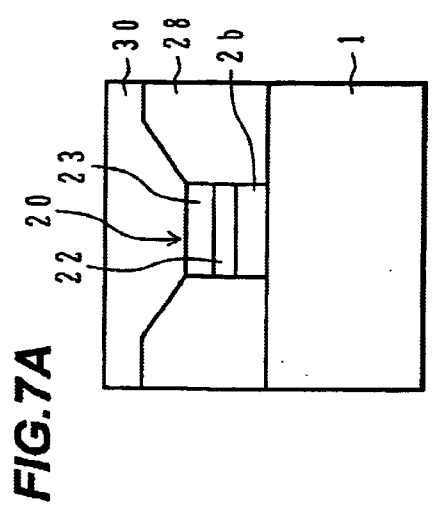
Figure 7B:
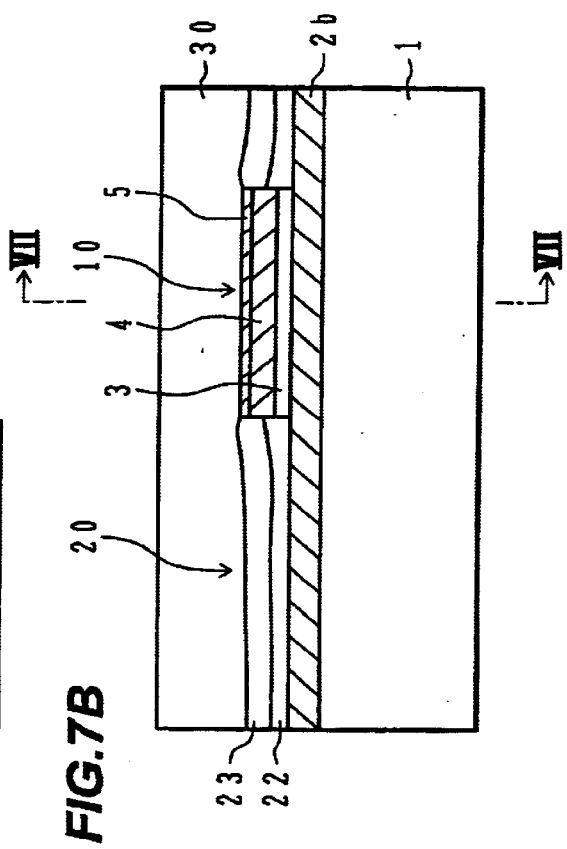

Next, with reference to FIGS. 7A to 7C, a semiconductor light reception device of the fourth embodiment will be described. FIG. 7A is a side view showing the light incidence end face of the semiconductor light reception device of the fourth embodiment, FIG. 7B is a cross sectional view taken along an optical axis of incidence light, and FIG. 7C is a cross sectional view taken along a direction perpendicular to the optical axis of incidence light (taken along one-dot chain line VII-VII shown in FIG. 7B). FIG. 7B corresponds to a cross sectional view taken along one-dot chain line VIII-VIII shown in FIG. 7C.

The cross sectional structure shown in FIG. 7B is similar to that of the third embodiment shown in FIG. 6B. The n-type layer 2b is patterned as shown in the side view of FIG. 1 and the cross sectional view of FIG. 7C.

As shown in FIG. 7A, the n-type layer 2b in the light waveguide 20 is patterned to have generally the same shape as the core 22 on the n-type layer 2b. As shown in FIG. 7C, the n-type layer 2b in the photo sensor 10 extends from both sides of the light reception layer 3 on the n-type layer 2b. Patterning the n-type layer 2b can be performed by covering the upper surface of the core 22 with the resist pattern 8 shown in FIGS. 2D1 and 2D2 of the first embodiment.

Also in the fourth embodiment, since the n-type layer 2b serves also as the lower clad layer of the light waveguide 20, it is easy to make the height of the core 22 be flush with the height of the light reception layer 3. In the fourth embodiment, the n-type layer 2b is disposed in an area narrower than that of the third embodiment. It is therefore possible to suppress unnecessary parasitic capacitance.

Next, with reference to FIGS. 8A and 8B, a semiconductor light reception device of the fifth embodiment will be described. In the first embodiment, as shown in FIG. 1A, the end faces of the core 22 and light reception layer 2 contact each other. In the fifth embodiment, the upper surface of a core is made in contact with the lower surface of a light reception layer.

Figure 8A:
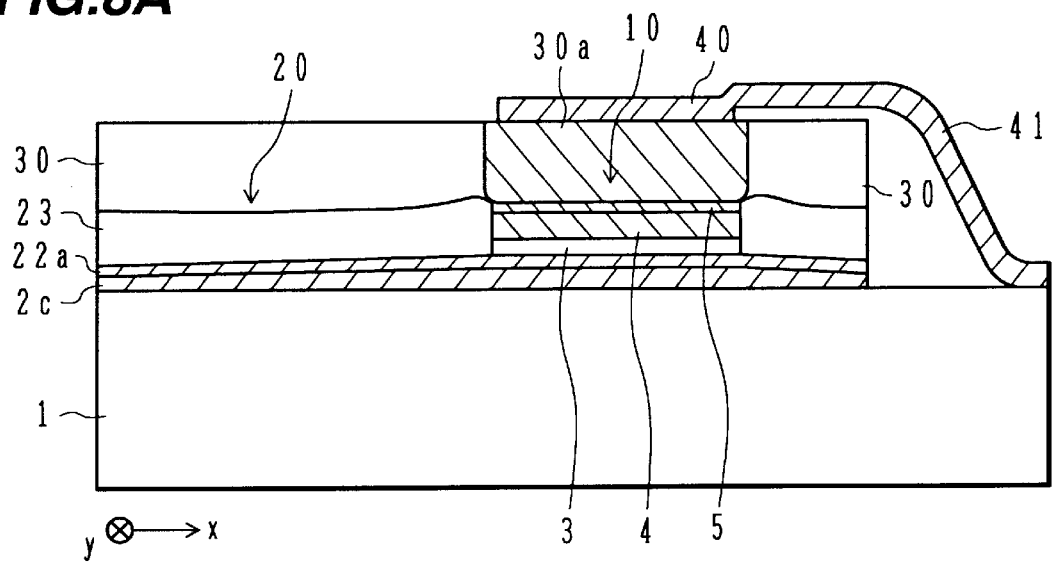
FIG. 8A is a cross sectional view of a semiconductor light reception device according to a fifth embodiment.

As shown in FIG. 8A, on the principal surface of the InP substrate 1, an n-type layer 2c is formed extending in the x-direction. On this n-type layer 2c, a core 22a made of n-type InGaAsP is formed. The core 22a extends to the n-type layer 2c of the photo sensor 10. A light reception layer 3 of the photo sensor 10 is formed on the core 22a extending to the photo sensor 10. The n-type layer 2c and core 22a in the light waveguide 20 become gradually thinner at positions remoter from the photo sensor 10. The other structures are similar to those of the first embodiment shown in FIG. 1A.

Next, a method of manufacturing the semiconductor light reception device shown in FIG. 8A will be described in comparison with the manufacture method for the semiconductor light reception device of the first embodiment.

Prior to executing the film forming process shown in FIG. 2A of the first embodiment, a selective growth mask pattern is formed on the surface of an InP substrate 1.

Figure 8B:
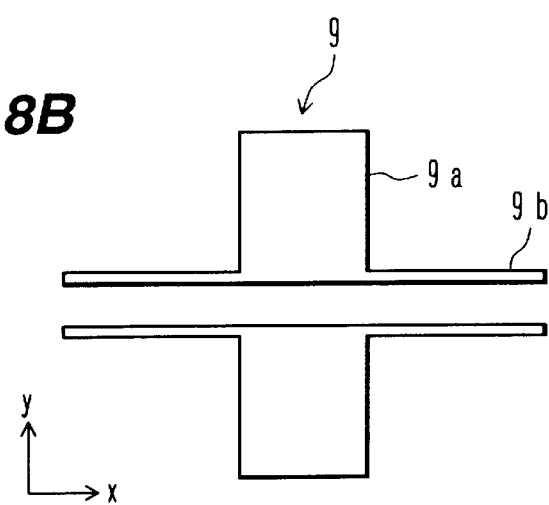
FIG. 8B is a plan view of a selective growth mask pattern used during a manufacture process.

FIG. 8B is a plan view of the selective growth mask pattern 9. A mask pattern 9 made of $SiO_2$ is disposed on both sides of an area where the core 22a shown in FIG. 8A is to be formed. The mask pattern 9 has broad central areas 9a on both sides of an area corresponding to the photo sensor 10 and narrow stripe areas 9b on both sides of an area corresponding to the light waveguide 20.

By using the mask pattern 9 as a mask, layers from the n-type layer 2 to the cap layer 5 shown in FIG. 2A are deposited. In the fifth embodiment, the core 22a is deposited between the n-type layer 2c and light reception layer 3. With this selective growth using the mask pattern 9, a film thickness in the x-direction in an area surrounded by the mask patterns 9 can be changed. For example, by properly selecting the growth conditions, while the thickness of the InP layer is maintained generally uniform, the thickness of the InGaAsP layer in the photo sensor 10 can be set to a three- to six-fold of the thickness at the light input end face of the light waveguide. After each of these layers is selectively grown, the mask pattern 9 is removed. The processes to follow are similar to the first embodiment.

Light propagated in the core 22a of the light waveguide 20 reaches the core 22a in the photo sensor 10. This light propagated to the core 22a in the photo sensor 10 leaks from the core upper surface into the light reception layer 3. Light can therefore be introduced into the light reception layer 3.

Next, with reference to FIGS. 9A and 9B, a semiconductor light reception device of the sixth embodiment will be described. The sixth embodiment is characterized by the electrode lead structure for the n-type layer and p-type layer of a pin junction.

Figure 9A:
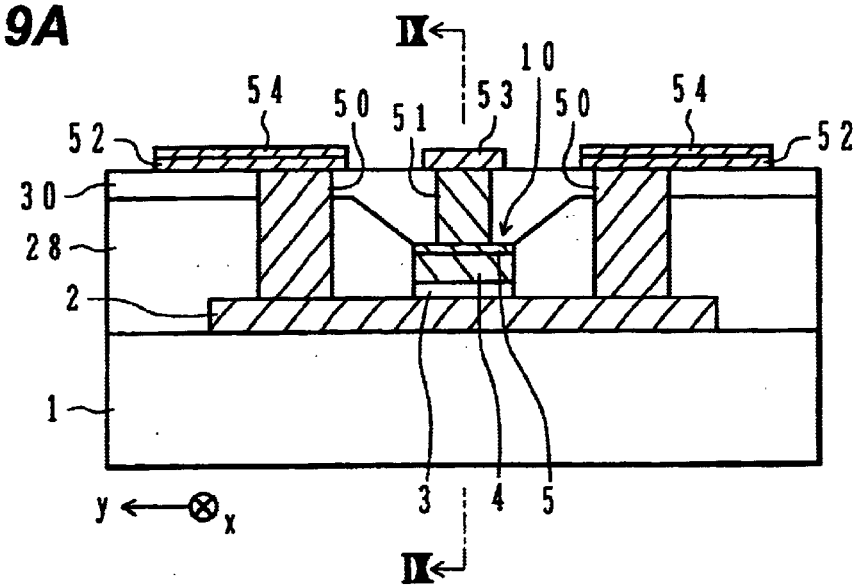
FIGS. 9A and 9B are cross sectional views of a semiconductor light reception device according to a sixth embodiment.
Figure 9B:
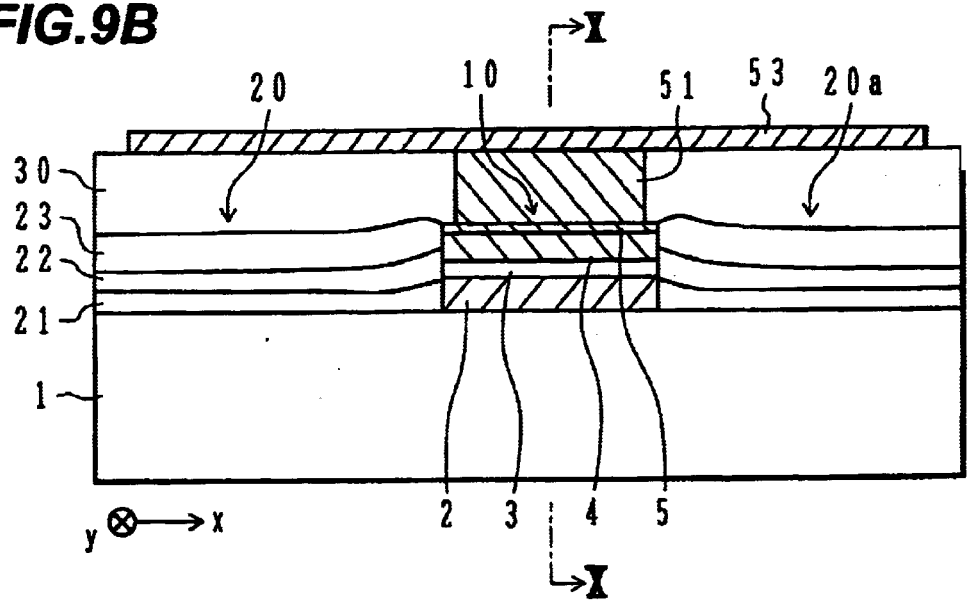

FIG. 9A is a cross sectional view showing a plane perpendicular to the optical axis of incidence light and passing through the photo sensor 10, and FIG. 9B is a cross sectional view taken along one-dot chain line IX-IX shown in FIG. 9A. FIG. 9A corresponds to a cross sectional view taken along one-dot chain line X-X of FIG. 9B. The structures other than the electrode lead structure are similar to those of the first embodiment shown in FIGS. 1A and 1C. In FIGS. 9A and 9B, like elements to those shown in FIGS. 1A and 1C are represented by using identical reference numerals. The electrode lead structure of the sixth embodiment may be applied to the semiconductor light reception devices of the third and fourth embodiments.

As shown in FIG. 9A, an n-type layer 2 extends to both sides of the photo sensor 10. To the upper surface of this extended area, an n-side conductive plug 50 is electrically connected. The n-side conductive plug 50 passes through a side protective film 28 and an upper protective film 30 and reaches the upper surface of the upper protective film 30. A p-side conductive plug 51 is electrically connected to a cap layer 5. The p-side conductive plug 51 passes through the upper protective film 30 and reaches its upper surface. The n-side conductive plug 50 and p-side conductive plug 51 can be formed by gold plating or silver paste. In order to obtain a sufficient ohmic contact, an ohmic metallizing process may be performed before the plug is formed.

An n-side electrode 52 is electrically connected to the n-side ohmic plug 50, and a p-side electrode 53 is electrically connected to the p-side conductive plug 51. The n-side electrode 52 and p-side electrode 53 are formed on the surface of the upper protective film 30.

As shown in FIG. 9B, the p-side electrode 53 extends to both sides of the photo sensor 10 in a cross section perpendicular to the y-direction. This structure allows the p-side electrode 53 to be made large even if the area of the pin junction is small. Under the p-side electrode 53 extended to both sides of the photo sensor 10, the insulating or high resistance light waveguide is disposed and a conductive region is not disposed. Therefore, even if the area of the p-side electrode 53 is made large, parasitic capacitance hardly increases.

A via hole for the p-side conductive plug 51 can be formed by using etchant capable of selectively etching InP relative to InGaAs, for example, by using mixed solution of $H_3PO_4$ and HCl. If plasma etching is used, the etching thickness can be precisely controlled. In forming a via hole for the n-side conductive plug 50, the etching time is controlled so that the etching process is stopped approximately when the upper surface of the n-type layer 2 is exposed. The conductive plugs 50 and 51 are formed by gold plating or silver paste.

In the semiconductor light reception device of the sixth embodiment, the n-side electrode 52 and p-side electrode 53 are disposed on the same plane. Therefore, the semiconductor light reception device can be mounted directly on a substrate having a coplanar strip line structure. For example, melting material for flip-chip connection, e.g., an AuSn solder layer 54, is formed on the surface of the n-side electrode 52 so that the n-side electrode 52 can be flip-chip bonded to a pad of the substrate having the coplanar strip line structure. In this case, electrical connection of the p-type electrode 53 can be realized by pressing the p-type electrode 53 to a pad of the substrate having the coplanar strip line structure.

In the six embodiment, as shown in FIG. 9B, the light waveguide 20a is disposed not only on the left side of the photo sensor 10 but also on the right side. Two light waveguides 20 and 20a are connected to one photo sensor 10. By inputting different optical signals to the two light waveguides, a heterodyne detection system can be configured without using an optical fiber coupler. If optical signals having different wavelengths are input, a beat signal corresponding to a difference frequency can be obtained.

Next, with reference to FIGS. 10A to 10C, a semiconductor light reception device of the seventh embodiment will be described. The semiconductor light reception device of the sixth embodiment has the structure suitable for direct connection to a substrate having the coplanar strip line structure. The semiconductor light reception device of the seventh embodiment has the structure suitable for connection to a substrate having a micro strip line structure.

Figure 10A:
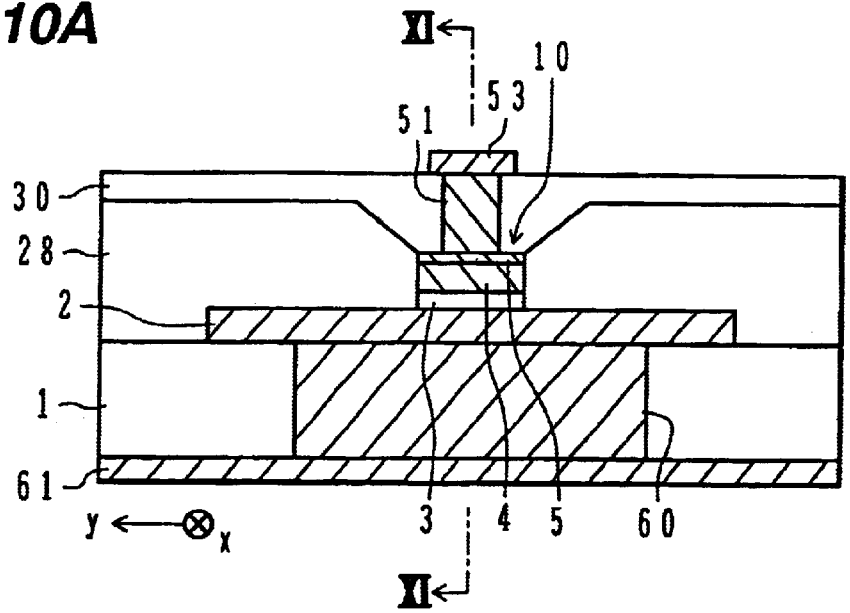
FIGS. 10A to 10C are cross sectional views of a semiconductor light reception device according to a seventh embodiment.
Figure 10B:
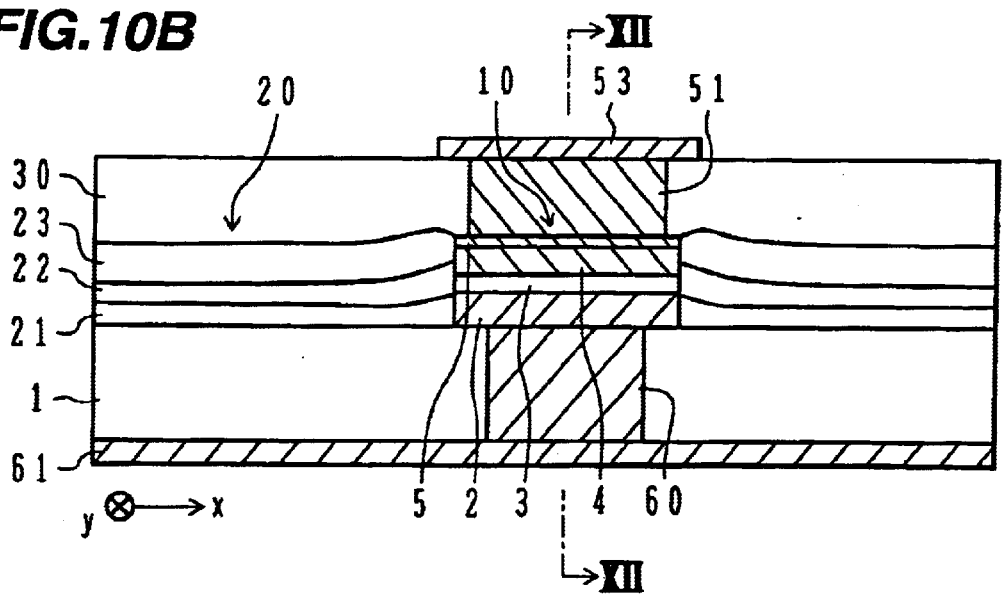

FIG. 10A is a cross sectional view showing a plane perpendicular to the optical axis of incidence light and passing through the photo sensor 10, and FIG. 10B is a cross sectional view taken along one-dot chain line XI-XI shown in FIG. 10A. FIG. 10A corresponds to a cross sectional view taken along one-dot chain line XII-XII of FIG. 10B. The structures other than the electrode lead structure are similar to those of the first embodiment shown in FIGS. 1A and 1C. In FIGS. 10A and 10B, like elements to those shown in FIGS. 1A and 1C are represented by using identical reference numerals. The electrode lead structure of the seventh embodiment may be applied to the semiconductor light reception devices of the third and fourth embodiments.

A p-side conductive plug 51 and a p-side electrode 53 shown in FIG. 10A have the structure similar to that of the sixth embodiment shown in FIG. 9A.

As shown in FIGS. 10A and 10B, an n-side conductive plug 60 is electrically connected to the lower surface of an n-type layer 2. The n-type conductive plug 60 passes through an InP substrate 1 and reaches the bottom surface thereof. An n-side electrode 61 is formed on the bottom surface of the InP substrate 1 and electrically connected to the n-side conductive plug 60.

Figure 10C:
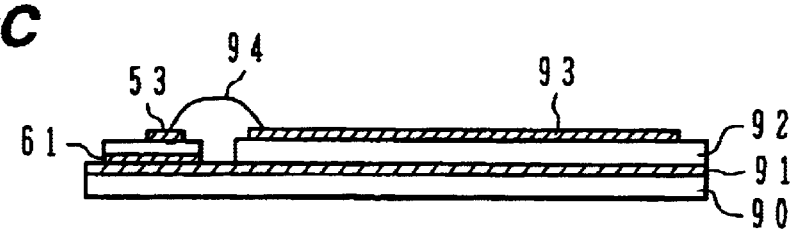

FIG. 10C is a schematic cross sectional view showing the semiconductor light reception device of the seventh embodiment mounted on a substrate having the micro strip line structure. A ground conductive layer 91 is formed on the surface of a mount substrate 90, and a dielectric layer 92 is formed in a partial surface area of the ground conductive layer 91. A micro strip line 93 is formed on the dielectric layer 92.

The n-side electrode 61 of the semiconductor light reception device of the seventh embodiment is fixed to and electrically connected to the ground conductive layer 91. A p-side electrode 53 is electrically connected to the micro strip line 93 via a conductive wire 94. In the seventh embodiment, the n-side electrode 61 is formed on the bottom surface of the InP substrate 1 so that the semiconductor light reception device can be easily mounted on the substrate having the micro strip line structure.

Next, with reference to FIGS. 11A and 11B, a semiconductor light reception device of the eighth embodiment will be described.

Figure 11A:
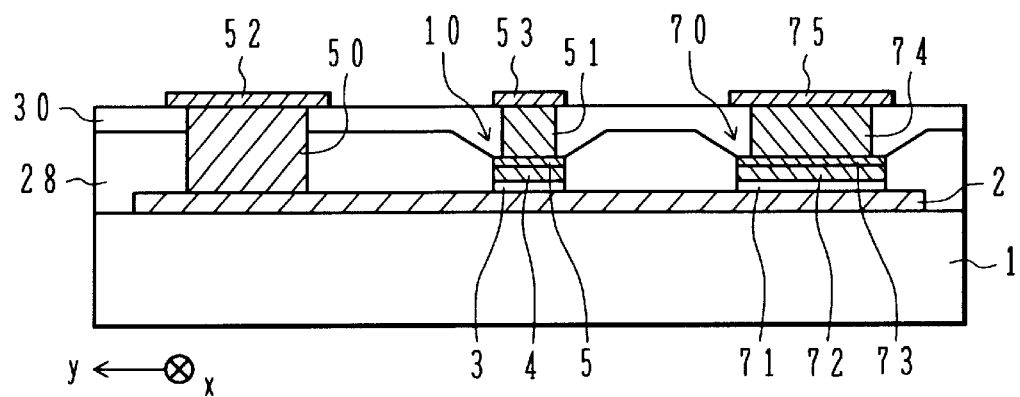
FIG. 11A is a cross sectional view of a semiconductor light reception device according to an eighth embodiment.

FIG. 11A corresponds to the cross sectional view of FIG. 9A of the sixth embodiment. In the sixth embodiment, the n-side conductive plugs 50 are disposed on both sides of the photo sensor 10. In the eighth embodiment, an n-side conductive plug 50 is disposed on one side of the photo sensor 10 and a pin diode 70 is disposed on the other side of the photo sensor 10.

The pin diode 70 is constituted of an n-type layer 2, an i-type layer 71, a p-type layer 72 and a cap layer 73. The n-type layer 2 constituting the pin diode 70 is used in common with the n-type layer 2 of the photo sensor 10. The i-type layer 71, p-type layer 72 and cap layer 73 are deposited by the same processes as used for a light reception layer 3, a p-type layer 4 and a cap layer 5 of the photo sensor 10, and thereafter patterned.

A p-side electrode 75 is electrically connected to the cap layer 73 via a p-side conductive plug 74. The p-side conductive plug 74 and p-side electrode 75 are formed by the same processes as used for a p-side conductive plug 51 and a p-side electrode 53.

Figure 11B:
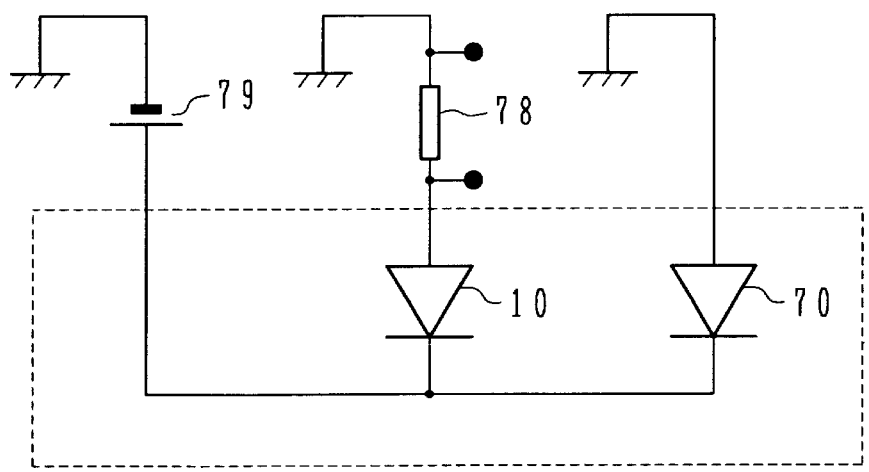
FIG. 11B is an equivalent circuit diagram of the device.

FIG. 11B is an equivalent circuit diagram of the semiconductor light reception device of the eighth embodiment, a power source and a load resistor. A d.c. power source 79 applies a positive voltage to the cathode of a pin type photodiode of a photo sensor 10. The anode of a pin type photodiode of the photo sensor 10 is grounded via a load 78.

A pin diode 70 is connected between the positive electrode of the d.c. power source 79 and the ground electrode. A reverse bias is applied from the d.c. power source 79 to the pin diode 70. The pin diode 70 functions as a bypass capacitor of a serial circuit constituted of the pin type photodiode of the photo sensor 10 and the load resistor 78.

In the eighth embodiment, the bypass capacitor is monolithically formed on the same substrate together with the photo sensor 10. If the bypass capacitor is formed externally, the function of the bypass capacitor is degraded by wiring inductance or the like. In the eighth embodiment, the bypass capacitor can be disposed near to the photo sensor 10, so that the length of wiring can be shortened and the function of the bypass capacitor can be prevented from being degraded.

In order to sufficiently exhibit the function of the bypass capacitor, it is preferable to make the area of the pin junction of the bypass capacitor larger than the area of the pin junction of the photo sensor 10.

Next, with reference to FIGS. 12A and 12B, a semiconductor light reception device of the ninth embodiment will be described.

Figure 12A:
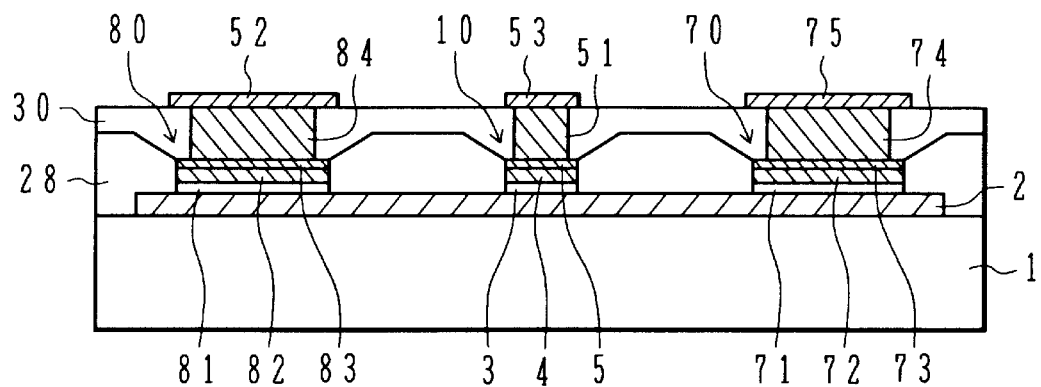
FIG. 12A is a cross sectional view of a semiconductor light reception device according to a ninth embodiment.

FIG. 12A is a cross sectional view corresponding to the cross sectional view of FIG. 11A of the eighth embodiment. In the eighth embodiment, the n-side electrode 52 is ohmic-contacted to the n-type layer 2 via the n-side conductive plug 50. In the ninth embodiment, an n-side electrode 52 is electrically connected to the n-type layer 2 via a pin diode 80. The other structures are the same as those of the eighth embodiment.

The pin diode 80 is constituted of an n-type layer 2, an i-type layer 81, a p-type layer 82 and a cap layer 83. The n-type layer 2 constituting the pin diode 80 is used in common with the n-type layer 2 of the photo sensor 10. The i-type layer 81, p-type layer 82 and cap layer 83 are deposited by the same processes as used for a light reception layer 3, a p-type layer 4 and a cap layer 5 of the photo sensor 10, and thereafter patterned. A conductive plug 84 electrically connects the n-side electrode 52 and cap layer 83. The conductive plug 84 is formed by the same process as used for a conductive plug 51 of the photo sensor 10.

Figure 12B:
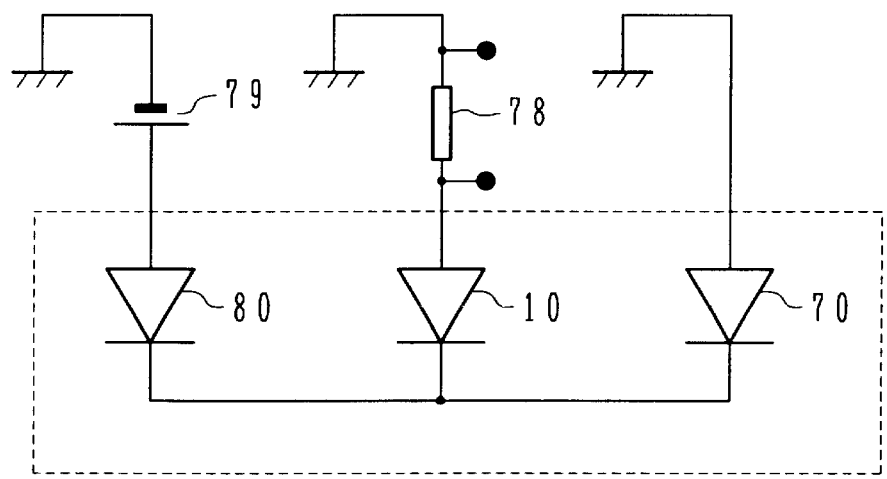
FIG. 12B is an equivalent circuit diagram of the device.

FIG. 12B is an equivalent circuit diagram of the semiconductor light reception device of the ninth embodiment, a power source and a load resistor. The positive electrode of a d.c. power source 79 is connected via the pin diode 80 in a forward bias state to the cathode of a pin type photodiode of the photo sensor 10 and to the cathode of the pin diode 70 functioning as a bypass capacitor.

In the ninth embodiment, the conductive plugs 51, 74 and 84 are formed by the same process. As compared to the eighth embodiment, the number of processes can therefore be reduced.

In the eighth and ninth embodiments, although the n-type layer 2 is made of n-type InP, it may be made of n-type InAlAs. If the n-type layer 2 is made of InAlAs, a two-dimensional electron gas layer is formed at the interface between the n-type layer 2 and light reception layer 3 and at the interface between the n-type layer 2 and side protective film 28. It is therefore possible to reduce the inductance components of a current path interconnecting the bypass capacitor 70 and photo sensor 10 and of a current path interconnecting the photo sensor 10 and n-side electrode 52. The electric characteristics can therefore be prevented from being degraded by inductance components.

Next, with reference to FIG. 13, a semiconductor light reception device of the tenth embodiment will be described.

Figure 13:
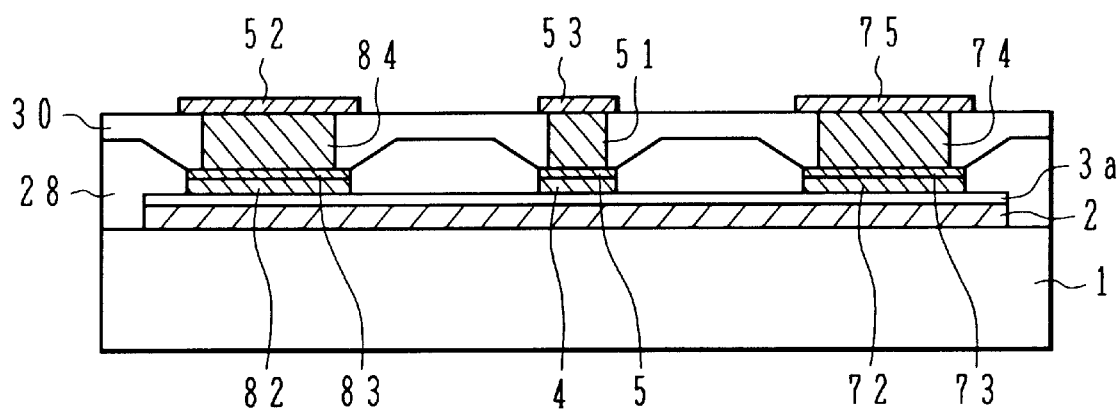
FIG. 13 is a cross sectional view of a semiconductor light reception device according to a tenth embodiment.

FIG. 13 is a cross sectional view of the semiconductor light reception device of the tenth embodiment, and corresponds to the cross sectional view of FIG. 12A of the ninth embodiment. In the ninth embodiment, as shown in FIG. 12A, the light reception layer 3 of the photo sensor 10, the i-type layer 72 of the pin diode 70 and the i-type layer 81 of the pin diode 80 are separated from each other. In the tenth embodiment, these layers are continuous forming a single i-type layer 3a. The other structures are similar to those of the ninth embodiment.

In the tenth embodiment, a two-dimensional electron gas layer is formed at the interface between the i-type layer 3a and n-type layer 2. As compared to the ninth embodiment, the two-dimensional electron gas layer becomes more uniform and inductance components can be reduced more.

Next, with reference to FIGS. 14A to 14E, a method will be described which method divides a single wafer formed with a plurality of semiconductor light reception devices into each light reception device.

Figure 14A:
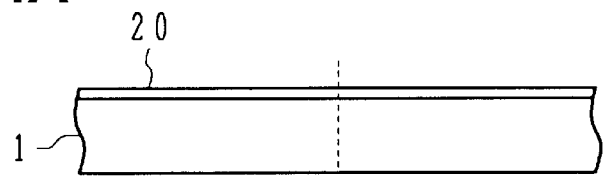
FIGS. 14A to 14C are cross sectional views of a substrate illustrating a process of slicing each light reception device from a wafer.
Figure 14B:
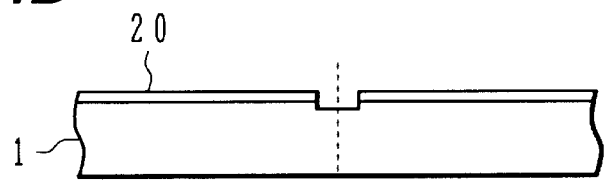

As indicated by a broken line in FIG. 14A, a wafer 1 is cleaved in an area of a light waveguide 20 to separate each light reception device. Alternatively, as shown in FIG. 14B, a light waveguide 20 in a cleaving area is partially etched to expose the end face of the light waveguide 20 and thereafter the wafer is cleaved at the position indicated by a broken line. In this case, it is preferable to form an antireflection coating on the end face of the light waveguide. In both of FIGS. 14A and 14B, the end face of the InP substrate 1 at the position of the end face of the light waveguide 20 is formed by cleaving.

Figure 14C:
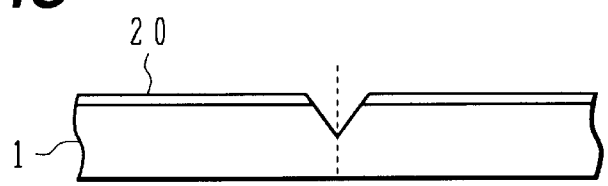
Figure 14D:
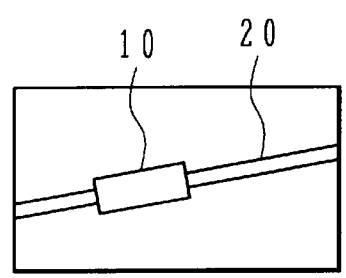
FIGS. 14D and 14E are plan views.
Figure 14E:
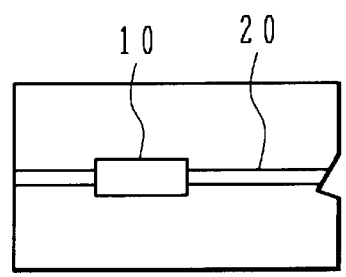

As shown in FIG. 14C, a groove having slanted side walls may be formed so that the end face of a light waveguide 20 is slanted relative to the substrate surface, and thereafter the wafer is cleaved at the position indicated by a broken line. As shown in FIG. 14D, as viewed along a substrate normal direction, a direction along which a light waveguide 20 extends may obliquely cross the input end face of the light waveguide 20. As shown in FIG. 14E, after a chip is cut, a recess may be formed at the input end face to form an oblique input end face. In this case, the end face of the light waveguide 20 is oblique relative to the cleaved face of the InP substrate 1.

In the first to tenth embodiments described above, although the photo sensor 10 is made of a pin type photodiode, it may be made of a pn-type photodiode. If a pn-type photodiode is used, the depletion layer of the pn junction functions as the light reception layer.

The light waveguide 20 of the above-described embodiments is preferably a light waveguide having a single mode near at the light incidence end face. The photo sensor 10 has preferably the structure that light of a single mode is propagated and absorbed.

In the above-described embodiments, although the semiconductor light reception device has a pin type photodiode made of InGaAs formed on an InP substrate, other group III–V compound semiconductor and mixed crystal may also be used.

The present invention has been described in connection with the preferred embodiments. The invention is not limited only to the above embodiments. It is apparent that various modifications, improvements, combinations, and the like can be made by those skilled in the art.

What is claimed is:

1. A semiconductor light reception device comprising:
   a substrate having a principal surface;
   a photo sensor formed in a partial area of the principal surface of said substrate, said photo sensor including a light reception layer parallel to the principal surface, the light reception layer being made of semiconductor and generating carriers in response to received light;
   a light waveguide formed in a partial area of the principal surface of said substrate, said light waveguide propagating light in a direction parallel to the principal surface and introducing light into the light reception layer, and said light waveguide including a lower clad, a core formed on the lower clad, and an upper clad formed on the core;

wherein a composition of the core is different than a composition of the light reception layer;

wherein a thickness of the core is greater than a thickness of the light reception layer, an insulating or high resistance side protective film covering at least a portion of a side face of said photo sensor;

electrodes for flowing current into the light reception layer of said photo sensor in a thickness direction of the light reception layer.

2. A semiconductor light reception device according to claim 1, wherein an end face of said substrate positioned at an end face of said light waveguide on a side opposite to said photo sensor is a cleaved surface.

3. A semiconductor light reception device according to claim 1, wherein:

said photo sensor includes a first layer formed on the principal surface of said substrate and made of semiconductor of a first conductivity type, the light reception layer formed on; the first layer, and a second layer formed on the light reception layer and made of semiconductor of a second conductivity type.

4. A semiconductor light reception device according to claim 3, wherein the core becomes gradually thicker at positions nearer to said photo sensor.

5. A semiconductor light reception device according to claim 3, wherein the first layer extends from an edge of the light reception layer in a direction crossing the light propagating direction, the side protective film covers a partial upper surface of an extended portion of the first layer, and one of said electrodes is electrically connected to the extended portion of the first layer.

6. A semiconductor light reception device according to claim 3, wherein said first layer of the first conductivity type covering the principal surface of said substrate also serves as the lower clad in said light waveguide.

7. A semiconductor light reception device according to claim 3, wherein the first layer in the photo sensor and the lower clad in said light waveguide have a same composition and film thickness and are continuous in terms of crystallography.

8. A semiconductor light reception device comprising:

a substrate having a principal surface;

a photo sensor formed in a partial area of the principal surface of said substrate, said photo sensor including a light reception layer parallel to the principal surface, the light reception layer being made of semiconductor and generating carriers in response to received light;

a light waveguide formed in a partial area of the principal surface of said substrate, said light waveguide propagating light in a direction parallel to the principal surface and introducing light into the light reception layer;

an insulating or high resistance side protective film covering at least a portion of a side face of said photo sensor;

electrodes for flowing current into the light reception layer of said photo sensor in a thickness direction of the light reception layer, wherein said photo sensor includes a first layer formed on the principal surface of said substrate and made of semiconductor of a first conductivity type, the light reception layer formed on the first layer, and a second layer formed on the light reception layer and made of semiconductor of a second conductivity type opposite to the first conductivity type, and wherein said light waveguide includes a lower clad, a core formed on the lower clad, and an upper clad formed on the core; and an upper protective film covering upper surfaces of said photo sensor, said light waveguide and the side protective film, said upper protective film in a region thereof above said photo sensor having a lower resistance than another region of said upper protective film.

9. A semiconductor light reception device according to claim 8, wherein said upper protective film in a region thereof above said photo sensor is thinner than in a region of said upper protective film above said light waveguide.

10. A semiconductor light reception device according to claim 8, wherein:

one of said electrodes is disposed on said upper protective film, electrically connected to the lower resistance region above said photo sensor and extends along said light waveguide; and the lower clad, core and upper clad of said light waveguide are made of insulating or high resistance semiconductor.

11. A semiconductor light reception device according to claim 1, further comprising another light waveguide formed on the principal surface of said substrate, said another light waveguide propagating light in a direction parallel to the principal surface and introducing the light into the light reception layer.

12. A semiconductor light reception device comprising:

a substrate having a principal surface;

a photo sensor formed in a partial area of the principal surface of said substrate, said photo sensor including a light reception layer parallel to the principal surface, the light reception layer being made of semiconductor and generating carriers in response to received light;

a light waveguide formed in a partial area of the principal surface of said substrate, said light waveguide propagating light in a direction parallel to the principal surface and introducing light into the light reception layer;

an insulating or high resistance side protective film covering at least a portion of a side face of said photo sensor;

electrodes for flowing current into the light reception layer of said photo sensor in a thickness direction for the light reception layer, wherein said photo sensor includes a first layer formed on the principal surface of said substrates and made of semiconductor of a first conductivity type, the light reception layer formed on the first layer, and a second layer formed on the light reception layer and made of semiconductor of a second conductivity type opposite to the first conductivity type, and wherein said light waveguide includes a lower clad, a core formed on the lower clad, and an upper clad formed on the core; and a bypass capacitor formed on the principal surface of said substrate for bypassing current flowing through the light reception layer in a thickness direction.

13. A semiconductor light reception device according to claim 12, wherein said bypass capacitor includes a lower electrode having same component and thickness as the first layer, a dielectric layer having a same composition and thickness as the light reception layer, and an upper electrode having a same composition and thickness as the second layer, and the lower electrode is continuous with the first layer in terms of crystallography.

14. A semiconductor light reception device according to claim 13, wherein the dielectric layer is continuous with the light reception layer in terms of crystallography.

15. A semiconductor light reception device according to claim 3, wherein one of said electrodes is formed on a bottom surface opposite to the principal surface of said substrate and electrically connected to the first layer via a conductive plug passing through said substrate.

16. A semiconductor light reception device according to claim 1, wherein an end face of said light waveguide opposite to said photo sensor is oblique relative to the principal surface of said substrate.

17. A semiconductor light reception device according to claim 1, wherein an end face of said light waveguide opposite to said photo sensor is oblique relative to a cleaved surface of said substrate.

18. A semiconductor light reception device according to claim 1, wherein the composition of the core is InGaAsP, and the composition of the light reception layer is InGaAs.

19. A semiconductor light reception device according to claim 1, wherein the photo sensor is a pin type photodiode comprising the light reception layer, an n-type layer and a p-type layer, the light reception layer being sandwiched between the n-type layer and the p-type layer, and wherein an end face of the core directly contacts an end face of the light reception layer and a part of an end face of at least one of the n-type layer and the p-type layer.

20. The semiconductor light reception device according to claim 1, further comprising:

an upper protective film covering an upper surface of said photo sensor and at least one other portion of said device, wherein said upper protective film covering the upper surface of the photosensor has a lower resistance than said upper protective film covering said at least one other portion of said device.

* * * * *